(12) United States Patent
Schnell et al.

(10) Patent No.: US 7,187,599 B2
(45) Date of Patent: Mar. 6, 2007

(54) INTEGRATED CIRCUIT CHIP HAVING A FIRST DELAY CIRCUIT TRIMMED VIA A SECOND DELAY CIRCUIT

(75) Inventors: Josef Schnell, Charlotte, VT (US); Ernst Stahl, Essex Junction, VT (US)

(73) Assignee: Infineon Technologies North America Corp., San Jose, CA (US)

( * ) Notice: Subject to any disclaimer, the term of this patent is extended or adjusted under 35 U.S.C. 154(b) by 99 days.

(21) Appl. No.: 11/137,736

(22) Filed: May 25, 2005

(65) Prior Publication Data

US 2006/0268632 A1   Nov. 30, 2006

(51) Int. Cl.
*G11C 7/00* (2006.01)
(52) U.S. Cl. ............ 365/194; 365/201; 365/149; 327/153; 327/182
(58) Field of Classification Search ........ 365/194, 365/201, 149; 327/153, 183
See application file for complete search history.

(56) References Cited

U.S. PATENT DOCUMENTS

| | | | |
|---|---|---|---|
| 4,697,140 A | 9/1987 | Saito et al. | |
| 5,202,626 A | 4/1993 | Pham et al. | |
| 5,457,400 A | 10/1995 | Ahmad et al. | |
| 5,483,175 A | 1/1996 | Ahmad et al. | |
| 6,075,418 A | 6/2000 | Kingsley et al. | |
| 6,424,593 B1* | 7/2002 | Kuge et al. | 365/233 |
| 6,538,936 B2 | 3/2003 | Tanaka et al. | |
| 6,556,021 B1 | 4/2003 | Nguyen et al. | |
| 6,781,893 B2* | 8/2004 | Hiraki et al. | 365/194 |
| 6,992,942 B2* | 1/2006 | Ito | 365/222 |
| 2002/0080667 A1 | 6/2002 | Tanaka et al. | |

* cited by examiner

*Primary Examiner*—Huan Hoang
(74) *Attorney, Agent, or Firm*—Dicke, Billig & Czaja, PLLC

(57) ABSTRACT

An integrated circuit chip including a first delay circuit and a second delay circuit. The first delay circuit has a first delay circuit topology configured to delay a signal a first delay. The second delay circuit has a second delay circuit topology configured to provide a second delay in a circuit loop that is configured to be monitored and provide an oscillating signal. The second delay circuit topology is substantially the same as the first delay circuit topology and the first delay circuit is configured to be trimmed to adjust the first delay based on the second delay and the oscillating signal.

35 Claims, 4 Drawing Sheets

INTEGRATED CIRCUIT CHIP HAVING A FIRST DELAY CIRCUIT TRIMMED VIA A SECOND DELAY CIRCUIT

BACKGROUND

Typically, a computer system includes a number of integrated circuit chips that communicate with one another to perform system applications. Chip speeds continue to increase and the amount of data communicated between chips continues to increase to meet the demands of system applications. As the volume of digital data communicated between chips increases, higher bandwidth communication links are needed to prevent data communication bottlenecks between chips.

Often, the computer system includes a controller, such as a micro-processor, and one or more memory chips, such as random access memory (RAM) chips. The RAM chips can be any suitable type of RAM, such as dynamic RAM (DRAM), double data rate synchronous DRAM (DDR-SDRAM), graphics DDR-SDRAM (GDDR-SDRAM), reduced latency DRAM (RLDRAM), pseudo static RAM (PSRAM), and low power DDR-SDRAM (LPDDR-SDRAM).

Typically, data and a strobe signal are communicated between chips, such as a controller and a RAM, via the communications link to read and write data. To write data to a chip, such as a RAM, data and a strobe signal are transmitted to the chip and the received data is sampled via the received strobe signal. To read data from the chip, data and a strobe signal are transmitted from the chip. Data and strobe signal timing are critical to reliable operation of the communications link.

Higher bandwidth communication links can be built by increasing input/output (I/O) data bit and strobe signal speeds. However, increasing I/O data bit and strobe signal speeds reduces data bit and strobe signal timing budgets, such as set up and hold times, which can lead to read and write timing problems. Sometimes, one or more delay circuits are included in critical signal paths, such as read and write data paths, to adjust signal timing. However, process variations can affect delay circuit delay times and cause race conditions, which lead to functional failures or a reduced timing budget. A reduced timing budget reduces the maximum speed of operation.

For these and other reasons there is a need for the present invention.

SUMMARY

One aspect of the present invention provides an integrated circuit chip including a first delay circuit and a second delay circuit. The first delay circuit has a first delay circuit topology configured to delay a signal a first delay. The second delay circuit has a second delay circuit topology configured to provide a second delay in a circuit loop that is configured to be monitored and provide an oscillating signal. The second delay circuit topology is substantially the same as the first delay circuit topology and the first delay circuit is configured to be trimmed to adjust the first delay based on the second delay and the oscillating signal.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
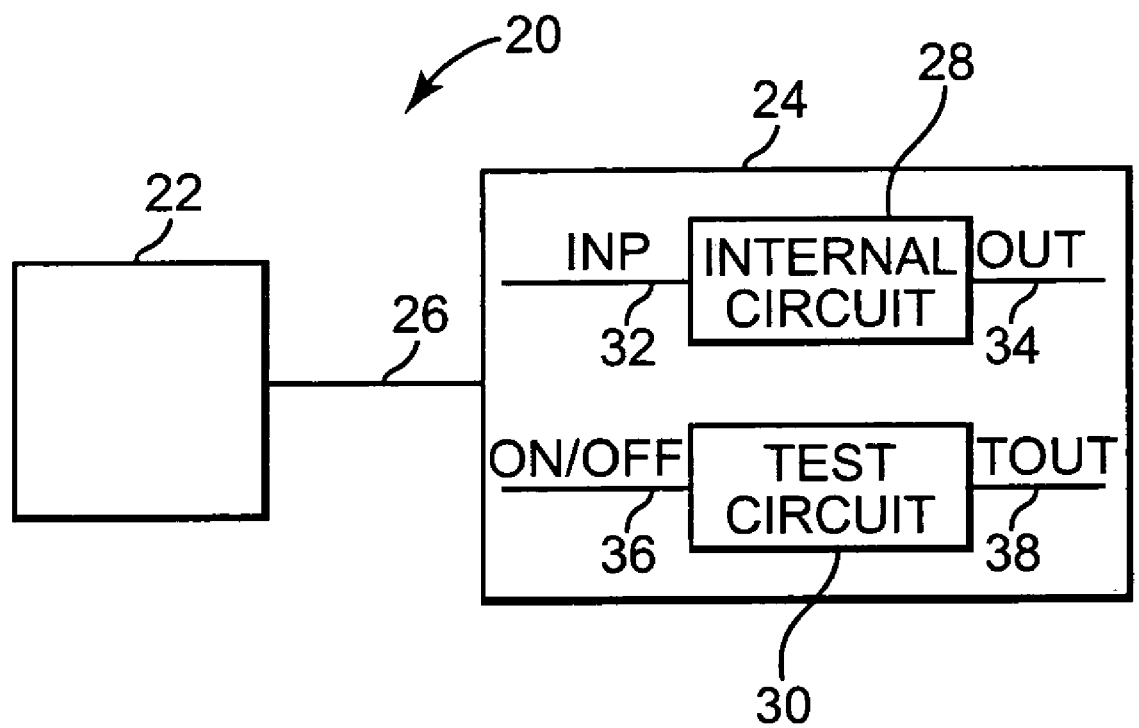
FIG. 1 is a block diagram illustrating one embodiment of a computer system according to the present invention.

FIG. 1 is a block diagram illustrating one embodiment of a computer system 20 according to the present invention. The computer system 20 includes a first integrated circuit chip 22 and a second integrated circuit chip 24. Chip 22 is electrically coupled to chip 24 via communications path 26. In one embodiment, chip 22 is a memory controller and chip 24 is a RAM, such as a DRAM, a DDR-SDRAM, a GDDR-SDRAM, an RLDRAM, a PSRAM or a LPDDR-SDRAM. The controller and RAM communicate with one another to perform system applications. In other embodiments, chip 22 and chip 24 can be any suitable chips that communicate with one another.

Chip 24 includes an internal circuit 28 and a test circuit 30. Internal circuit 28 receives an input signal INP at 32 and provides an output signal OUT at 34. Test circuit 30 receives an on/off signal ON/OFF at 36 and provides a test output signal TOUT at 38. Test circuit 30 is turned on via on/off signal ON/OFF at 36 and test output signal TOUT at 38 is measured to determine or characterize timing delays in test circuit 30. Timing delays in internal circuit 28 are trimmed based on the timing delays of test circuit 30.

Internal circuit 28 receives input signal INP at 32 and delays input signal INP at 32 via an internal delay circuit that can be trimmed to a delay time value. A signal delayed via the internal delay circuit is provided as output signal OUT at 34. Internal circuit 28 can be any suitable circuit including a delay circuit that can be trimmed. In one embodiment, internal circuit 28 is a critical signal path circuit, such as a read data path circuit in a RAM or a write data path circuit in a RAM. In one embodiment, internal circuit 28 includes critical signal path circuitry that is coupled in series to the internal delay circuit and input signal INP at 32 is delayed via the critical signal path circuitry and the internal delay circuit to provide output signal OUT at 34.

Test circuit 30 includes an oscillator that includes a test delay circuit. The test delay circuit in test circuit 30 is substantially the same or a copy of the internal delay circuit of internal circuit 28. The oscillator circuit in test circuit 30 is turned on via the on/off signal ON/OFF at 36 to provide an oscillating signal and the frequency of the oscillating signal is based on the delay time of the test delay circuit. Measuring the frequency of the oscillating signal or a derivative of the oscillating signal characterizes the time delay of the test delay circuit. The internal delay circuit in internal circuit 28 is trimmed based on the delay time of the test delay circuit in test circuit 30.

Trimming the internal delay circuit in internal circuit 28 based on the time delay of the test delay circuit in test circuit 30 reduces or eliminates time delay problems due to process variations, such as chip to chip variations and lot to lot variations. Time delays for critical signal paths can be adjusted on a chip to chip basis to minimize the reduction in timing budgets due to process variations, voltage variations, and temperature variations and maximize operating frequency. Also, this can increase yields and reduce chip costs. In addition, reliable and higher bandwidth communications between chip 22 and chip 24 can be maintained using increased I/O data bit and strobe signal speeds.

In one embodiment, the frequency of the oscillating signal is divided down to provide a divided oscillating output signal and the frequency of the divided oscillating output signal is measured to characterize the time delay of the test delay circuit. In one embodiment, the test delay circuit is trimmed a trim value to provide a selected oscillation frequency of the oscillating signal or a derivative of the oscillating signal and the internal delay circuit is trimmed based on the trim value for the test delay circuit. In one embodiment, test circuit 30 includes test critical signal path circuitry that is coupled in series to the test delay circuit and the frequency of the oscillator circuit is based on the test critical signal path circuitry and the test delay circuit. In one embodiment, the test critical signal path circuitry is substantially the same or a copy of critical signal path circuitry in internal circuit 28. In one embodiment, chip 24 includes any suitable number of internal circuits, such as internal circuit 28, and corresponding test circuits, such as test circuit 30.

Figure 2:
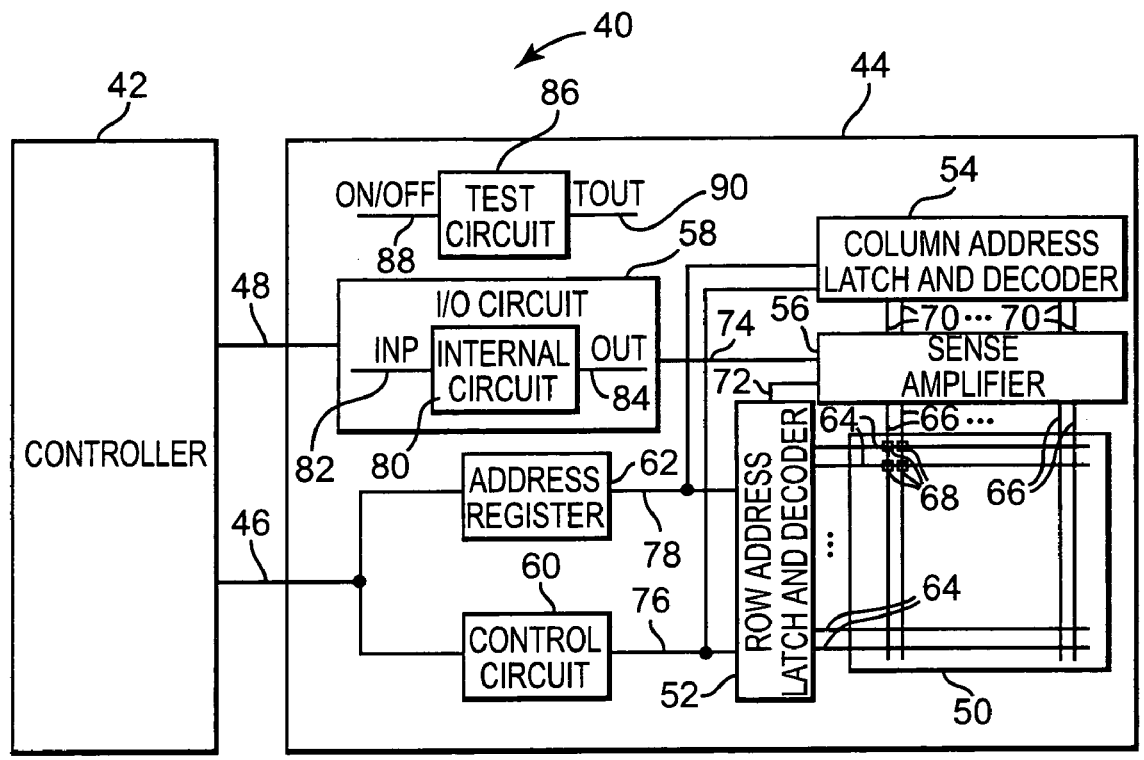
FIG. 2 is a block diagram illustrating one embodiment of a computer system including a controller and a RAM according to the present invention.

FIG. 2 is a block diagram illustrating one embodiment of a computer system 40 according to the present invention. Computer system 40 includes a controller 42 and a RAM 44. Controller 42 is electrically coupled to RAM 44 via memory communications path 46 and data communications path 48. Controller 42 provides row and column addresses and control signals to RAM 44 via memory communications path 46. Controller 42 provides data signals and strobe signals to RAM 44 and receives data signals and strobe signals from RAM 44 via data communications path 48. RAM 44 can be any suitable type of RAM, such as a DRAM, a DDR-SDRAM, a GDDR-SDRAM, a PSRAM, or a LPDDR-SDRAM.

RAM 44 includes an array of memory cells 50, a row address latch and decoder 52, a column address latch and decoder 54, a sense amplifier circuit 56, a RAM I/O circuit 58, a control circuit 60, and an address register 62. Conductive word lines 64, referred to as row select lines, extend in the x-direction across the array of memory cells 50. Conductive bit lines 66, referred to as digit lines, extend in the y-direction across the array of memory cells 50. A memory cell 68 is located at each cross point of a word line 64 and a bit line 66.

Each word line 64 is electrically coupled to row address latch and decoder 52 and each bit line 66 is electrically coupled to one of the sense amplifiers in sense amplifier circuit 56. The sense amplifier circuit 56 is electrically coupled to column address latch and decoder 54 via conductive column select lines 70. Also, sense amplifier circuit 56 is electrically coupled to row address latch and decoder 52 via communications path 72 and to RAM I/O circuit 58 via I/O communications path 74. RAM I/O circuit 58 is electrically coupled to controller 42 via data communications path 48. Data signals and strobe signals are transferred between RAM I/O circuit 58 and controller 42 via data communications path 48.

Controller 42 is electrically coupled to RAM I/O circuit 58 via data communications path 48 and to control circuit 60 and address register 62 via memory communications path 46. Control circuit 60 is electrically coupled to row address latch and decoder 52 and column address latch and decoder 54 via control communications path 76. Address register 62 is electrically coupled to row address latch and decoder 52 and column address latch and decoder 54 via row and column address lines 78.

Address register 62 receives row and column addresses from controller 42 via memory communications path 46. Address register 62 supplies a row address to row address latch and decoder 52 via row and column address lines 78, and control circuit 60 supplies a RAS signal to row address latch and decoder 52 via control communications path 76 to latch the supplied row address into row address latch and decoder 52. Address register 62 supplies a column address to column address latch and decoder 54 via row and column address lines 78, and control circuit 60 supplies a CAS signal to column address latch and decoder 54 via control communications path 76 to latch the supplied column address into column address latch and decoder 54.

Row address latch and decoder 52 receives row addresses and RAS signals and latches the row addresses into row address latch and decoder 52. Row address latch and decoder 52 decodes each of the row addresses to select a row of memory cells 68. In addition, row address latch and decoder 52 provides sense amplifier activation signals and equalization and precharge signals to sense amplifier circuit 56 via communications path 72.

Column address latch and decoder 54 activates column select lines 70 to connect sense amplifiers in sense amplifier circuit 56 to RAM I/O circuit 58. Column address latch and decoder 54 receives a column address and latches the column address into column address latch and decoder 54. Column address latch and decoder 54 decodes the column address to select addressed column select lines 70. In addition, column address latch and decoder 54 receives column select line activation signals from control circuit 60 via control communications path 76. The column select line activation signals indicate which of the addressed column select lines 70 are to be activated by column address latch and decoder 54. Column address latch and decoder 54 activates column select lines 70 that are addressed by the column address and selected for activation by the column select line activation signals. Activated column select lines 70 are provided to sense amplifier circuit 56 to connect sense amplifiers in sense amplifier circuit 56 to RAM I/O circuit 58.

Control circuit 60 receives addresses and control signals from controller 42 via memory communications path 46. Controller 42 provides control signals, such as read/write enable, RAS, and CAS signals to control circuit 60. Control circuit 60 provides RAS signals to row address latch and decoder 52 and CAS signals to column address latch and decoder 54. Also, control circuit 60 provides control signals to column address latch and decoder 52 to selectively activate column select lines 70.

Controller 42 and RAM I/O circuit 58 communicate data signals and strobe signals between controller 42 and RAM 44 via data communications path 48. Controller 42 and RAM 44 are similar to chip 22 and chip 24 (shown in FIG. 1). RAM I/O circuit 58 includes a suitable number of transmitter and receiver pairs and controller 42 includes a suitable number of transmitter and receiver pairs. Each transmitter and receiver pair in RAM I/O circuit 58 corresponds to a transmitter and receiver pair in controller 42. Data communications path 48 includes one or more signal pathways and each transmitter and receiver pair in I/O circuit 58 is electrically coupled to the corresponding transmitter and receiver pair in controller 42 via at least one of the signal pathways in data communications path 48.

Sense amplifier circuit 56 includes sense amplifiers, equalization and precharge circuits, and switches. The sense amplifiers are differential input sense amplifiers and each sense amplifier receives one bit line 66 at each of two differential inputs. One of the differential inputs receives a data bit from a selected memory cell 68 and the other one of the differential inputs is used as a reference. The equalization and precharge circuits equalize the voltage on the bit lines 66 connected to the same sense amplifier prior to a read or write operation.

To read a data bit, a sense amplifier amplifies the difference between the data bit value and the reference value and provides a sensed output value to RAM I/O circuit 58 via I/O communications path 74. One of the transmitter and receiver pairs in RAM I/O circuit 58 receives the sensed output value and provides the sensed output value to the corresponding transmitter and receiver pair in controller 42 via data communications path 48.

To write a data bit, one of the transmitter and receiver pairs in controller 42 provides a data signal to the corresponding transmitter and receiver pair in RAM I/O circuit 58 via data communications path 48. Also, one of the transmitter and receiver pairs in controller 42 provides a strobe signal to the corresponding transmitter and receiver pair in RAM I/O circuit 58 via data communications path 48. RAM I/O circuit 58 receives the data signal and the strobe signal and samples the data signal via the strobe signal to provide sampled data bits.

RAM I/O circuit 58 provides each data bit to a sense amplifier in sense amplifier circuit 56 via I/O communications path 74. RAM I/O circuit 58 overdrives the sense amplifier to drive the data bit value onto a bit line 66 that is connected to one of the memory cells 68. RAM I/O circuit 58 also overdrives the inverse of the data bit value onto the reference bit line 66. The sense amplifier writes the received data bit value into the selected memory cell 68.

RAM I/O circuit 58 includes an internal circuit 80 that receives an input signal INP at 82 and provides an output signal OUT at 84. Internal circuit 80 is similar to internal circuit 28 (shown in FIG. 1). Internal circuit 80 receives input signal INP at 82 and delays input signal INP at 82 via an internal delay circuit that can be trimmed to a delay time value. A signal delayed via the internal delay circuit is provided as output signal OUT at 84. Internal circuit 80 can be any suitable circuit including a delay circuit that can be trimmed. In one embodiment, internal circuit 80 is a critical signal path circuit, such as a read data path circuit or a write data path circuit in RAM I/O circuit 58. In one embodiment, internal circuit 80 includes critical signal path circuitry that is coupled in series to the internal delay circuit and input signal INP at 82 is delayed via the critical signal path circuitry and the internal delay circuit to provide output signal OUT at 84.

RAM 44 also includes a test circuit 86 that receives an on/off signal ON/OFF at 88 and provides a test output signal TOUT at 90. Test circuit 86 is similar to test circuit 30 (shown in FIG. 1). Test circuit 86 includes an oscillator that includes a test delay circuit. The test delay circuit in test circuit 86 is substantially the same or a copy of the internal delay circuit of internal circuit 80. The oscillator circuit in test circuit 86 is turned on via the on/off signal ON/OFF at 88 to provide an oscillating signal and the frequency of the oscillating signal is based on the delay time of the test delay circuit. Measuring the frequency of the oscillating signal or a derivative of the oscillating signal characterizes the time delay of the test delay circuit. The internal delay circuit in internal circuit 80 is trimmed based on the delay time of the test delay circuit in test circuit 86.

In one embodiment, the frequency of the oscillating signal is divided down to provide a divided oscillating output signal and the frequency of the divided oscillating output signal is measured to characterize the time delay of the test delay circuit. In one embodiment, the test delay circuit is trimmed a trim value to provide, a selected oscillation frequency of the oscillating signal or a derivative of the oscillating signal and the internal delay circuit is trimmed based on the trim value for the test delay circuit. In one embodiment, test circuit 86 includes test critical signal path circuitry that is coupled in series to the test delay circuit and the frequency of the oscillator circuit is based on the test critical signal path circuitry and the test delay circuit. In one embodiment, the test critical signal path circuitry is substantially the same or a copy of critical signal path circuitry in internal circuit 80. In one embodiment, RAM 44 includes any suitable number of internal circuits, such as internal circuit 80, and corresponding test circuits, such as test circuit 86.

During a read operation, control circuit 60 receives read control signals and address register 62 receives the row address of a selected memory cell or cells 68. The row address is supplied from address register 62 to row address latch and decoder 52 and latched into row address latch and decoder 52 by control circuit 60 and a RAS signal. Row address latch and decoder 52 decodes the row address and activates the selected word line 64. As the selected word line 64 is activated, the value stored in each memory cell 68 coupled to the selected word line 64 is passed to the respective bit line 66. The bit value stored at a memory cell 68 is detected by a sense amplifier that is electrically coupled to the respective bit line 66.

Next, control circuit 60 and address register 62 receive the column address of the selected memory cell or cells 68. The column address is supplied from address register 62 to column address latch and decoder 54 and latched into column address latch and decoder 54 by control circuit 60 and a CAS signal. The column address latch and decoder 54 decodes the column address to select column select lines 70. Control circuit 60 provides control signals to column address latch and decoder 54 to selectively activate column select lines 70 and connect selected sense amplifiers to RAM I/O circuit 58. Sensed output values are provided to transmitter and receiver pairs in RAM I/O circuit 58 and provided to the corresponding transmitter and receiver pairs in controller 42 via data communications path 48.

During a write operation, control circuit 60 receives write control signals and address register 62 receives the row address of a selected memory cell or cells 68. The row address is supplied from address register 62 to row address latch and decoder 52 and latched into row address latch and decoder 52 by control circuit 60 and a RAS signal. The row address latch and decoder 52 decodes the row address and activates the selected word line 64. As the selected word line 64 is activated, the value stored in each memory cell 68 coupled to the selected word line 64 is passed to the respective bit line 66 and the sense amplifier that is electrically coupled to the respective bit line 66.

Data to be stored in the array of memory cells 50 is supplied from transmitter and receiver pairs in controller 42 to transmitter and receiver pairs in I/O circuit 58 via data communications path 48. RAM I/O circuit 58 receives the data signals and strobe signals and sample the data signals via the strobe signals to provide sampled data bits.

Control circuit 60 and address register 62 receive the column address of the selected memory cell or cells 68. Address register 62 supplies the column address to column address latch and decoder 54 and the column address is latched into column address latch and decoder 54 by control circuit 60 and a CAS signal. Column address latch and decoder 54 receives column select line activation signals from control circuit 60 and activates selected column select lines 70 to connect sense amplifiers in sense amplifier circuit 56 to RAM I/O circuit 58. RAM I/O circuit 58 provides data bits to sense amplifiers in sense amplifier circuit 56 via I/O communications path 74. RAM I/O circuit 58 overdrives the sense amplifiers to write data to the selected memory cell or cells 68 via bit lines 66.

Figure 3:
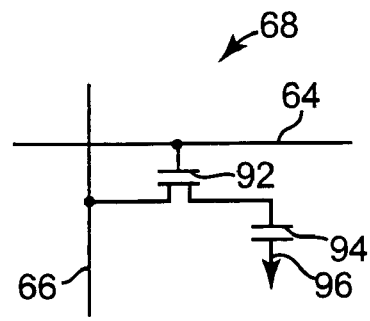
FIG. 3 is a diagram illustrating one embodiment of a memory cell in an array of memory cells.

FIG. 3 is a diagram illustrating one embodiment of a memory cell 68 in the array of memory cells 50. Memory cell 68 includes a transistor 92 and a capacitor 94. The gate of transistor 92 is electrically coupled to a word line 64. One side of the drain-source path of transistor 92 is electrically coupled to a bit line 66 and the other side of the drain-source path is electrically coupled to one side of capacitor 94. The other side of capacitor 94 is electrically coupled to a reference 96, such as one-half the supply voltage. Capacitor 94 is charged and discharged to represent a logic 0 or a logic 1.

During a read operation, word line 64 is activated to turn on transistor 92 and the value stored on capacitor 94 is read by a sense amplifier via bit line 66. During a write operation, word line 64 is activated to turn on transistor 92 to access capacitor 94. The sense amplifier connected to bit line 66 is overdriven to write a data value onto capacitor 94 via bit line 66 and transistor 92.

A read operation on memory cell 68 is a destructive read operation. After each read operation, capacitor 94 is recharged or discharged to the data value that was just read. In addition, even without a read operation, the charge on capacitor 94 discharges over time. To retain a stored-value, memory cell 68 is refreshed periodically by reading and/or writing memory cell 68. All memory cells 68 in the array of memory cells 50 are periodically refreshed to maintain their values.

Figure 4:
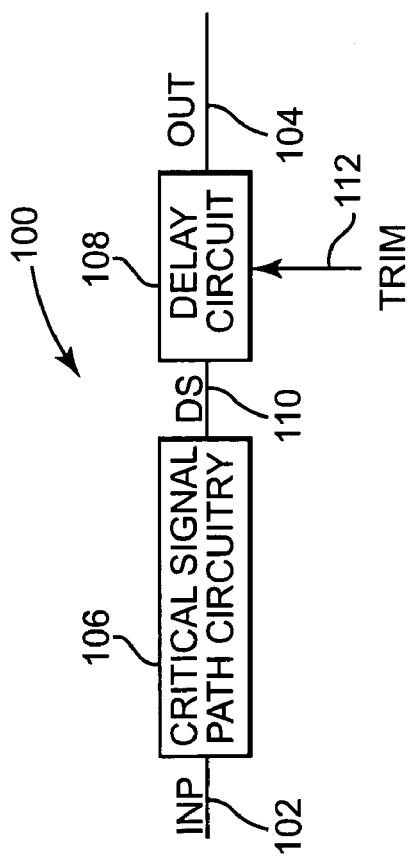
FIG. 4 is a diagram illustrating one embodiment of an internal circuit.

FIG. 4 is a diagram illustrating one embodiment of an internal circuit 100 that receives input signal INP at 102 and provides output signal OUT at 104. Internal circuit 100 is similar to internal circuit 28 (shown in FIG. 1) and internal circuit 80 (shown in FIG. 2).

Internal circuit 100 includes critical signal path circuitry 106 and an internal delay circuit 108. The critical signal path circuitry 106 is electrically coupled to delay circuit 108 via internal signal path 110. Critical signal path circuitry 106 receives input signal INP at 102 and provides a delayed signal DS at 110 to delay circuit 108 via internal signal path 110. Delay circuit 108 receives the delayed signal DS at 110 and delays the delayed signal DS at 110 to provide output signal OUT at 104. The delay through internal circuit 100 from input signal INP at 102 to output signal OUT at 104 includes the delay through critical signal path circuitry 106 plus the delay through delay circuit 108. The delay through delay circuit 106 can be adjusted or trimmed at 112 to provide a delay through internal circuit 100 that maximizes operational frequency and operational time budgets.

Critical signal path circuitry 106 can be any suitable signal path circuit that performs any suitable function on input signal INP at 102. In one embodiment, critical signal path circuitry 106 is write data path circuitry that receives data from another integrated circuit chip. In one embodiment, critical signal path circuitry 106 is read data path circuitry that transmits data to another integrated circuit chip.

Delay circuit 108 provides a delay time that can be adjusted or trimmed at 112 via trim steps. In one embodiment, delay circuit 108 includes one or more multiplexers that can be programmed to select an inverter chain length that provides a delay through delay circuit 108. In one embodiment, delay circuit 108 includes one or more capacitors that can be programmed in or out of delay circuit 108 to adjust the delay through delay circuit 108. In one embodiment, delay circuit 108 includes electrical fuses that can be programmed to trim the delay through delay circuit 108. In one embodiment, delay circuit 108 includes laser fuses that can be programmed to trim the delay through delay circuit 108.

Figure 5:
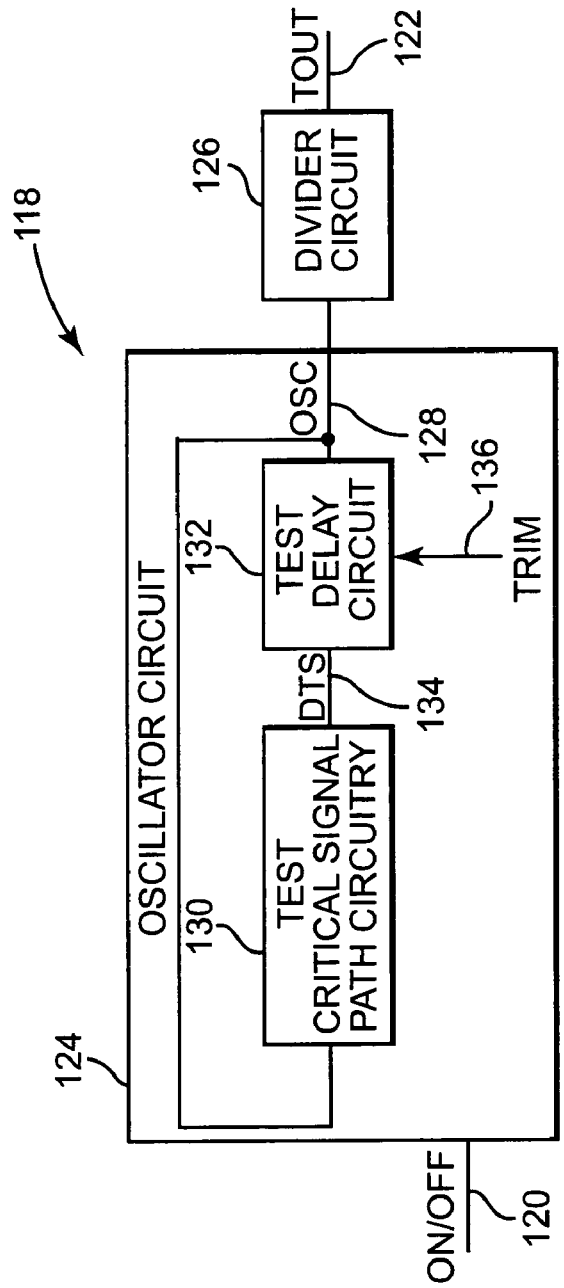
FIG. 5 is a diagram illustrating one embodiment of a test circuit.

FIG. 5 is a diagram illustrating one embodiment of a test circuit 118 that receives an on/off signal ON/OFF at 120 and provides a test output signal TOUT at 122. Test circuit 118 is similar to test circuit 30 (shown in FIG. 1) and test circuit 86 (shown in FIG. 2).

Test circuit 118 includes an oscillator circuit 124 and a divider circuit 126. Oscillator circuit 124 is electrically coupled to divider circuit 126 via oscillator signal path 128. Oscillator circuit 124 is a ring oscillator that receives on/off signal ON/OFF at 120 and provides an oscillator signal OSC at 128 to divider circuit 126 via oscillator signal path 128. Oscillator circuit 124 is turned off via on/off signal ON/OFF at 120 to provide a constant voltage level in oscillator signal OSC at 128. Oscillator circuit 124 is turned on via on/off signal ON/OFF at 120 to provide an oscillation frequency in oscillator signal OSC at 128. Divider circuit 126 receives oscillator signal OSC at 128 and divides the oscillation frequency of oscillator signal OSC at 128 down to provide a divided oscillating output signal as test output signal TOUT at 122. The oscillation frequency of test output signal TOUT at 122 is monitored and measured. Also, the oscillation frequency of oscillator signal OSC at 128 can be determined via multiplication of the measured oscillation frequency of test output signal TOUT at 122.

Oscillator circuit 124 includes test critical signal path circuitry 130 and test delay circuit 132. The output of test critical signal path circuitry 130 is electrically coupled to the input of test delay circuit 132 via test signal path 134. The output of test delay circuit 132 is electrically coupled to the input of divider circuit 126 and the input of test critical signal path circuitry 130 via oscillator signal path 128. The output of divider circuit 126 provides test output signal TOUT at 122.

Test critical signal path circuitry 130 and test delay circuit 132 provide oscillator signal OSC at 128. Test critical signal path circuitry 130 receives oscillator signal OSC at 128 and provides delayed test signal DTS at 134 to test delay circuit 132 via test signal path 134. Test delay circuit 132 receives the delayed test signal DTS at 134 and delays the delayed test signal DTS at 134 to provide oscillator signal OSC at 128. Test critical signal path circuitry 130 or test delay circuit 132 inverts the received input signal to provide an output signal that is inverted from the received input signal. In one embodiment, test critical signal path circuitry 130 inverts oscillator signal OSC at 128 and provides a delayed test signal DTS at 134 that is inverted as compared to the received oscillator signal OSC at 128. In one embodiment, test delay circuit 132 inverts delayed test signal DTS at 134 and provides an oscillator signal OSC at 128 that is inverted as compared to the received delayed test signal DTS at 134.

The oscillation frequency of oscillator signal OSC at 128 is based on the delay through test critical signal path circuitry 130 and the delay through test delay circuit 132. The delay through test delay circuit 132 can be adjusted or trimmed at 136 to provide a selected oscillation frequency in oscillator signal OSC at 128 and test output signal TOUT at 122. In one embodiment, the delay through test delay circuit 132 can not be adjusted to change the oscillation frequency of oscillator signal OSC at 128 and test output signal TOUT at 122.

Test critical signal path circuitry 130 can be any suitable signal path circuit that performs any suitable function. In one embodiment, test critical signal path circuitry 130 is substantially the same as critical signal path circuitry 106 (shown in FIG. 4). In one embodiment, test critical signal path circuitry 130 has substantially the same topology as critical signal path circuitry 106. In one embodiment, test critical signal path circuitry 130 is a layout copy of critical signal path circuitry 106.

Test delay circuit 132 is similar to delay circuit 108 (shown in FIG. 4). In one embodiment, test delay circuit 132 is substantially the same as delay circuit 108. In one embodiment, test delay circuit 132 has substantially the same topology as delay circuit 108. In one embodiment, test delay circuit 132 is a layout copy of delay circuit 108.

Test delay circuit 132 provides a delay time that can be adjusted or trimmed at 136 via trim steps. In one embodiment, test delay circuit 132 includes one or more multiplexers that can be programmed to select an inverter chain length that provides a delay through test delay circuit 132. In one embodiment, test delay circuit 132 includes one or more capacitors that can be programmed in or out of test delay circuit 132 to adjust the delay through test delay circuit 132. In one embodiment, test delay circuit 132 can be soft set via test code to a trim value that adjusts or trims the delay through test delay circuit 132.

In operation, oscillator circuit 124 is turned on via on/off signal ON/OFF at 120. Oscillator circuit 124 provides an oscillation frequency in oscillator signal OSC at 128 and divider circuit 126 divides down the oscillation frequency in oscillator signal OSC at 128 to provide a divided oscillating output signal as test output signal TOUT at 122. The oscillation frequency of test output signal TOUT at 122 is measured and the delay time of test delay circuit 132 is substantially determined from the measured oscillation frequency of test output signal TOUT at 122. Also, the oscillating frequency of oscillating signal OSC at 128 can be determined from the oscillation frequency of test output signal TOUT at 122.

Next, test delay circuit 132 is trimmed a test trim value to change the oscillation frequency in test output signal TOUT at 122. Test delay circuit 132 is trimmed to obtain a selected delay through test critical signal path circuitry 130 and test delay circuit 132. The test trim value is stored and delay circuit 108 (shown in FIG. 4) is trimmed via the test trim value or a corresponding internal delay circuit trim value to adjust the delay through internal circuit 100 and maximize operational frequency and operational time budgets. In another embodiment, the delay through test delay circuit 132 can not be adjusted or trimmed to change the oscillation frequency of test output signal TOUT at 122, and the oscillation frequency of test output signal TOUT at 122 is looked up in a table that includes oscillation frequencies of test output signal TOUT at 122 and corresponding trim values for delay circuit 108 (shown in FIG. 4).

Figure 6:
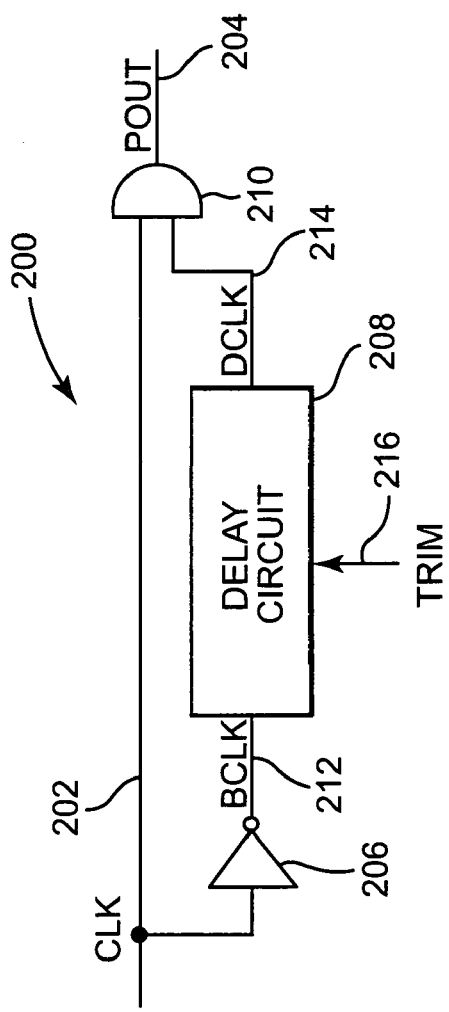
FIG. 6 is a diagram illustrating one embodiment of an internal circuit that receives a clock signal and provides a pulsed output signal.

FIG. 6 is a diagram illustrating one embodiment of an internal circuit 200 that receives a clock signal CLK at 202 and provides a pulsed output signal POUT at 204. Internal circuit 200 is similar to internal circuit 28 (shown in FIG. 1), internal circuit 80 (shown in FIG. 2), and internal circuit 100 of FIG. 4.

Internal circuit 200 includes an inverting buffer 206, an internal delay circuit 208, and an AND gate 210. The output of buffer 206 is electrically coupled to the input of delay circuit 208 via buffer signal path 212. Buffer 206 receives clock signal CLK at 202 and provides a buffered clock signal BCLK at 212 to delay circuit 208 via buffer signal path 212. The output of delay circuit 208 is electrically coupled to one input of AND gate 210 via delayed clock signal path 214. Delay circuit 208 provides a delayed clock signal DCLK at 214 to AND gate 210. The other input of AND gate 210 receives clock signal CLK at 202 and AND gate 210 provides pulses in pulsed output signal POUT at 204. The delay through delay circuit 208 determines the pulse width of the pulses in pulse output signal POUT at 204. The delay through delay circuit 208 can be adjusted or trimmed at 216 to provide a pulse width that maximizes operational frequency and operational time budgets.

Delay circuit 208 provides a delay time that can be adjusted or trimmed at 216 via trim steps. In one embodiment, delay circuit 208 includes one or more multiplexers that can be programmed to select an inverter chain length that provides a delay through delay circuit 208. In one embodiment, delay circuit 208 includes one or more capacitors that can be programmed in or out of delay circuit 208 to adjust the delay through delay circuit 208. In one embodiment, delay circuit 208 includes electrical fuses that can be programmed to trim the delay through delay circuit 208. In one embodiment, delay circuit 208 includes laser fuses that can be programmed to trim the delay through delay circuit 208.

Figure 7:
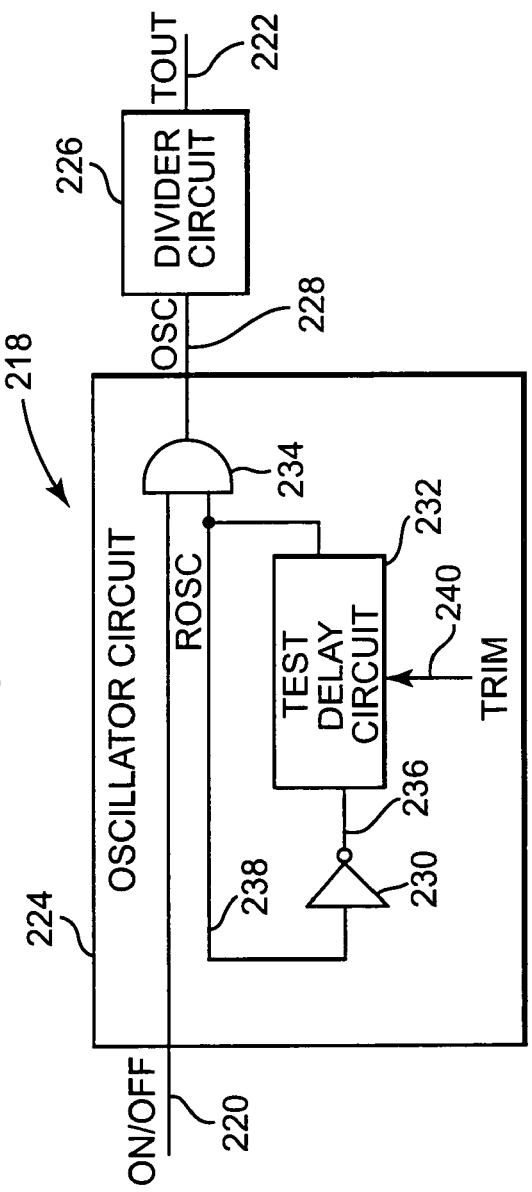
FIG. 7 is a diagram illustrating one embodiment of a test circuit that includes an inverter and a test delay circuit in a ring oscillator.

FIG. 7 is a diagram illustrating one embodiment of a test circuit 218 that receives an on/off signal ON/OFF at 220 and provides a test output signal TOUT at 222. Test circuit 218 is similar to test circuit 30 (shown in FIG. 1), test circuit 86 (shown in FIG. 2), and test circuit 118 of FIG. 5.

Test circuit 218 includes an oscillator circuit 224 and a divider circuit 226. Oscillator circuit 224 is electrically coupled to divider circuit 226 via oscillator signal path 228. Oscillator circuit 224 receives on/off signal ON/OFF at 220 and provides an oscillator signal OSC at 228 to divider circuit 226 via oscillator signal path 228. Oscillator circuit 224 is turned off via a low logic level in on/off signal ON/OFF at 220 to provide a low logic level in oscillator signal OSC at 228. Oscillator circuit 224 is turned on via a high logic level in on/off signal ON/OFF at 220 to provide an oscillation frequency in oscillator signal OSC at 228. Divider circuit 226 receives oscillator signal OSC at 228 and divides the oscillation frequency of oscillator signal OSC at 228 down to provide a divided oscillating output signal as test output signal TOUT at 222. The oscillation frequency of test output signal TOUT at 222 is monitored and measured. Also, the oscillation frequency of oscillator signal OSC at 228 can be determined via multiplication of the measured oscillation frequency of test output signal TOUT at 222.

Oscillator circuit 224 includes an inverter 230, test delay circuit 232, and an AND gate 234. Inverter 230 and test delay circuit 232 provide a ring oscillator. The output of inverter 230 is electrically coupled to the input of test delay circuit 232 via test signal path 236. The output of test delay circuit 232 is electrically coupled to one input of AND gate 234 and the input of inverter 230 via delay signal path 238. The other input of AND gate 234 receives on/off signal ON/OFF at 220 and the output of AND gate 234 is electrically coupled to the input of divider circuit 226 via oscillator signal path 228. The output of divider circuit 226 provides test output signal TOUT at 222.

Inverter 230 and test delay circuit 232 provide a ring oscillator signal ROSC at 238. Inverter 230 receives ring oscillator signal ROSC at 238 and inverts the ring oscillator signal ROSC at 238 to provide an inverted ring oscillator signal at 236 to test delay circuit 232 via test signal path 236. Test delay circuit 232 receives and delays the inverted ring oscillator signal at 236 to provide ring oscillator signal ROSC at 238.

The AND gate 234 receives ring oscillator signal ROSC at 238. If on/off signal ON/OFF at 220 is at a low logic level, AND gate 234 provides a low logic level in oscillator signal OSC at 228. If on/off signal ON/OFF at 220 is at a high logic level, AND gate 234 provides an oscillating signal in oscillator signal OSC at 228. The oscillation frequency of oscillator signal OSC at 228 is equal to the oscillation frequency of ring oscillator signal ROSC at 238.

The oscillation frequency of ring oscillator signal ROSC at 238 and oscillator signal OSC at 228 is based on the delay through inverter 230 and the delay through test delay circuit 232. The delay through test delay circuit 232 can be adjusted or trimmed at 240 to provide a selected oscillation frequency in oscillator signal OSC at 228 and test output signal TOUT at 222. In one embodiment, the delay through test delay circuit 232 can not be adjusted to change the oscillation frequency of oscillator signal OSC at 228 and test output signal TOUT at 222.

Inverter 230 is similar to buffer 206 (shown in FIG. 6). In one embodiment, inverter 230 is substantially the same as buffer 206 and the delay through inverter 230 is substantially the same as the delay through buffer 206. In one embodiment, inverter 230 has substantially the same topology as buffer 206. In one embodiment, inverter 230 is substantially a layout copy of buffer 206.

Test delay circuit 232 is similar to delay circuit 208 (shown in FIG. 6). In one embodiment, test delay circuit 232 is substantially the same as delay circuit 208. In one embodiment, test delay circuit 232 has substantially the same topology as delay circuit 208. In one embodiment, test delay circuit 232 is a layout copy of delay circuit 208.

Test delay circuit 232 provides a delay time that can be adjusted or trimmed at 240 via trim steps. In one embodiment, test delay circuit 232 includes one or more multiplexers that can be programmed to select an inverter chain length that provides a delay through test delay circuit 232. In one embodiment, test delay circuit 232 includes one or more capacitors that can be programmed in or out of test delay circuit 232 to adjust the delay through test delay circuit 232. In one embodiment, test delay circuit 232 can be soft set via test code to a trim value that adjusts or trims the delay through test delay circuit 232.

In operation, inverter 230 and test delay circuit 232 provide an oscillating signal in ring oscillator signal ROSC at 238. Oscillator circuit 224 is turned on via a high logic level in on/off signal ON/OFF at 220 and oscillator circuit 224 provides an oscillating signal having an oscillation frequency in oscillator signal OSC at 228. Divider circuit 226 divides down the oscillation frequency of oscillator signal OSC at 228 to provide a divided oscillating output signal as test output signal TOUT at 222. The oscillation frequency of test output signal TOUT at 222 is measured and the delay time of test delay circuit 232 is determined from the measured oscillation frequency of test output signal TOUT at 222. Also, the oscillating frequency of oscillating signal OSC at 228 can be determined from the oscillation frequency of test output signal TOUT at 222.

Next, test delay circuit 232 is trimmed a test trim value to change the oscillation frequency in test output signal TOUT at 222. Test delay circuit 232 is trimmed to obtain a selected delay through inverter 230 and test delay circuit 232. The test trim value is stored and delay circuit 208 (shown in FIG. 6) is trimmed via the test trim value or a corresponding internal delay circuit trim value to adjust the delay through delay circuit 208 and provide a pulse width in pulsed output signal POUT at 204 that maximizes operational frequency and operational time budgets. In one embodiment, the delay through test delay circuit 232 can not be adjusted or trimmed to change the oscillation frequency of test output signal TOUT at 222, and the oscillation frequency of test output signal TOUT at 222 is looked up in a table that includes oscillation frequencies of test output signal TOUT at 222 and corresponding trim values for delay circuit 208 (shown in FIG. 6).

Trimming an internal delay circuit, such as delay circuit 108 (shown in FIG. 4) and delay circuit 208 (shown in FIG. 6), based on the delay through a test delay circuit, such as test delay circuit 132 (shown in FIG. 5) and test delay circuit 232 (shown in FIG. 7), reduces or eliminates delay problems of internal circuits due to process variations, such as chip to chip variations and lot to lot variations. Time delays for critical signal paths can be adjusted on a chip to chip basis to minimize the reduction in timing budgets due to process variations, voltage variations, and temperature variations and maximize operating frequency. Also, this can increase yields and reduce chip costs. In addition, reliable and higher bandwidth communications can be maintained using increased I/O data bit and strobe signal speeds. In one embodiment, a chip can include any suitable number of internal circuits and corresponding test circuits and the process of adjusting the delay through an internal delay circuit based on the delay through a corresponding test delay circuit is repeated for each internal circuit and corresponding test delay circuit pair.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit chip, comprising:
   a first delay circuit having a first delay circuit topology configured to delay a signal a first delay; and
   a second delay circuit having a second delay circuit topology configured to provide a second delay in a circuit loop that is configured to be monitored and provide an oscillating signal, wherein the second delay circuit topology is substantially the same as the first delay circuit topology and the first delay circuit is configured to be trimmed to adjust the first delay based on the second delay and the oscillating signal.

2. The integrated circuit chip of claim 1, comprising:
   a first circuit having a first circuit topology configured to delay the signal a first circuit delay; and
   a second circuit having a second circuit topology configured to provide a second circuit delay in the circuit loop, wherein the second circuit topology is substantially the same as the first circuit topology and the second circuit delay is substantially the same as the first circuit delay.

3. The integrated circuit chip of claim 1, wherein the second delay circuit is configured to be trimmed to adjust the second delay in the circuit loop and the first delay circuit is configured to be trimmed to adjust the first delay based on an adjustment to the second delay.

4. The integrated circuit chip of claim 1, wherein the oscillating signal has an oscillation frequency that is measured to provide a measured frequency value and the first delay circuit is trimmed via comparing the measured frequency value to a table of frequency values and trim values.

5. The integrated circuit chip of claim 1, comprising a divider circuit configured to receive the oscillating signal and divide the oscillating signal down to provide a divided oscillating output signal.

6. The integrated circuit chip of claim 1, wherein the first delay circuit and the second delay circuit are located less than 1 millimeter apart.

7. A random access memory, comprising:
   a first circuit including a first delay circuit configured to provide a first delay, wherein the first circuit is configured to provide an oscillating signal having an oscillating signal frequency based on the first delay; and
   a second circuit including a second delay circuit configured to delay a signal a second delay, wherein the first delay circuit is substantially a copy of the second delay circuit and the oscillating signal is monitored to characterize the first delay and trim the second delay circuit to adjust the second delay based on the first delay.

8. The random access memory of claim 7, wherein the first circuit includes a first critical path circuit configured to provide a first critical path delay and the oscillating signal frequency is based on the first delay and the first critical path delay, and the second circuit includes a second critical path circuit configured to delay the signal a second critical path delay, wherein the first critical path delay is substantially equal to the second critical path delay.

9. The random access memory of claim 8, wherein the first critical path circuit is substantially a copy of the second critical path circuit.

10. The random access memory of claim 7, wherein the first circuit includes a divider circuit configured to receive the oscillating signal and divide the oscillating signal frequency to provide a divided oscillating output signal.

11. The random access memory of claim 7, wherein the first circuit and the second circuit are located less than 1 millimeter apart.

12. The random access memory of claim 7, wherein the second circuit includes at least one of a multiplexer and a capacitor configured to trim the second delay circuit.

13. The random access memory of claim 7, wherein the second circuit includes at least one of a laser fuse and an electrical fuse configured to trim the second delay circuit.

14. A random access memory, comprising:
   a test circuit configured to provide an oscillating output signal, wherein the test circuit comprises:
      an oscillator configured to provide an oscillating signal having an oscillating signal frequency and comprising:
         a first critical path circuit configured to provide a first critical path delay; and
         a first delay circuit configured to provide a first delay, wherein the oscillating signal frequency is based on the first delay and the first critical path delay; and
      a divider circuit configured to receive the oscillating signal and divide the oscillating signal frequency down to provide the oscillating output signal; and
   an internal circuit comprising:
      a second critical path circuit configured to delay a signal a second critical path delay, wherein the second critical path circuit is substantially a copy of the first critical path circuit; and
      a second delay circuit configured to delay the signal a second delay, wherein the first delay circuit is substantially a copy of the second delay circuit and the second delay circuit is trimmed based on the first delay of the first delay circuit.

15. The random access memory of claim 14, wherein the first delay circuit is configured to be trimmed to adjust the first delay and the oscillating signal frequency of the oscillating signal, and the second delay circuit is configured to be trimmed to adjust the second delay based on the adjustment to the first delay.

16. The random access memory of claim 14, wherein the oscillating signal frequency is monitored to provide a measured frequency value and the second delay circuit is trimmed to adjust the second delay via comparing the measured frequency value to a table of frequency values and trim values.

17. A random access memory, comprising:
   means for delaying a first signal a first delay;
   means for providing an oscillating signal having an oscillating signal frequency based on the first delay;
   means for observing the first delay;
   means for delaying a second signal a second delay, that is substantially a copy of the means for delaying a first signal a first delay; and
   means for adjusting the second delay based on the first delay.

18. The random access memory of claim 17, wherein the means for providing an oscillating signal comprises:
   means for delaying the first signal a first circuit delay; and
   means for providing an oscillating signal having an oscillating signal frequency based on the first delay and the first circuit delay.

19. The random access memory of claim 18, comprising:
   means for delaying the second signal a second circuit delay that is substantially equal to the first circuit delay.

20. The random access memory of claim 19, wherein the means for delaying the second signal a second circuit delay is substantially a copy of the means for delaying the first signal a first circuit delay.

21. The random access memory of claim 17, wherein the means for observing comprises:
   means for dividing the oscillating signal frequency to provide a divided oscillating output signal.

22. A method for adjusting circuit delay times in an integrated circuit chip, comprising:
   delaying a first signal a first delay via a first delay circuit;
   providing an oscillating signal having an oscillating signal frequency based on the first delay;
   observing the oscillating signal to characterize the first delay;
   delaying a second signal a second delay via a second delay circuit that is substantially a copy of the first delay circuit; and
   adjusting the second delay based on the first delay.

23. The method of claim 22, wherein providing an oscillating signal comprises:
   delaying the first signal a first circuit delay via a first circuit; and
   providing an oscillating signal having an oscillating signal frequency based on the first delay and the first circuit delay.

24. The method of claim 23, comprising:
   delaying the second signal a second circuit delay that is substantially equal to the first circuit delay.

25. The method of claim 22, wherein observing the oscillating signal comprises:
   dividing the oscillating signal frequency to provide a divided oscillating output signal; and
   observing the divided oscillating output signal.

26. The method of claim 22, comprising:
   trimming the first delay circuit to change the first delay and the oscillating signal frequency.

27. The method of claim 22, wherein adjusting the second delay comprises:
   trimming the second delay circuit via fuses to adjust the second delay.

28. A method for adjusting circuit delay times in a random access memory, comprising:
   delaying a first signal a first delay via a first delay circuit having a first delay circuit topology;
   delaying a second signal a second delay in a circuit loop via a second delay circuit having a second delay circuit topology that is substantially the same as the first delay circuit topology;
   providing an oscillating signal via the circuit loop having an oscillating signal frequency based on the second delay; and
   trimming the first delay circuit to adjust the first delay based on the second delay and the oscillating signal.

29. The method of claim 28, comprising:
   delaying the first signal a first critical path delay via a first critical path circuit having a first critical path circuit topology; and
   delaying the second signal a second critical path delay in the circuit loop via a second critical path circuit having a second critical path circuit topology that is substantially the same as the first circuit topology.

30. The method of claim 28, wherein trimming the first delay circuit comprises:
   trimming the second delay circuit to adjust the second delay in the circuit loop and the oscillating signal frequency; and
   trimming the first delay circuit to adjust the first delay based on the trim applied to the second delay circuit and the adjustment made to the second delay and the oscillating signal frequency.

31. The method of claim 28, wherein trimming the first delay circuit comprises:
   measuring the oscillating signal frequency to provide a measured frequency value;
   comparing the measured frequency value to a table of frequency values to determine a trim value; and
   trimming the first delay circuit based on the trim value.

32. The method of claim 28, comprising:
   dividing the oscillating signal frequency down to provide a divided oscillating output signal;
   monitoring the divided oscillating output signal.

33. A method for adjusting a delay time in a random access memory, comprising:
   delaying a first signal a first critical path delay via a first critical path circuit in an oscillating circuit;
   delaying the first signal a first delay via a first delay circuit in the oscillating circuit;
   providing an oscillating signal having an oscillating signal frequency based on the first critical path delay and the first delay via the oscillating circuit;
   dividing the oscillating signal frequency to provide a divided oscillating signal frequency;
   delaying a second signal a second critical path delay via a second critical path circuit;
   delaying the second signal a second delay via a second delay circuit; and
   trimming the second delay circuit to adjust the second delay based on the first delay and the divided oscillating signal frequency.

34. The method of claim 33, wherein trimming the second delay circuit comprises:
   trimming the first delay circuit to adjust the first delay and the divided oscillating signal frequency; and
   trimming the second delay circuit to adjust the second delay based on the trim applied to the first delay circuit and the adjustment made to the first delay and the divided oscillating signal frequency.

35. The method of claim 33, wherein trimming the second delay circuit comprises:
   measuring the divided oscillating signal frequency to provide a measured frequency value;
   comparing the measured frequency value to a table of frequency values to determine a trim value; and
   trimming the second delay circuit based on the trim value.

* * * * *